(12) United States Patent
Sakai et al.

(10) Patent No.: US 11,304,309 B2
(45) Date of Patent: Apr. 12, 2022

(54) PRINTED CIRCUIT BOARD AND METHOD FOR MANUFACTURING PRINTED CIRCUIT BOARD

(71) Applicant: SUMITOMO ELECTRIC INDUSTRIES, LTD., Osaka (JP)

(72) Inventors: Shoichiro Sakai, Osaka (JP); Eiko Imazaki, Osaka (JP); Koji Nitta, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/048,806

(22) PCT Filed: Mar. 7, 2019

(86) PCT No.: PCT/JP2019/008989
§ 371 (c)(1),
(2) Date: Oct. 19, 2020

(87) PCT Pub. No.: WO2019/216012
PCT Pub. Date: Nov. 14, 2019

(65) Prior Publication Data
US 2021/0153358 A1 May 20, 2021

(30) Foreign Application Priority Data
May 11, 2018 (JP) .............................. JP2018-092173

(51) Int. Cl.
*B32B 3/00* (2006.01)
*H05K 3/38* (2006.01)
(Continued)

(52) U.S. Cl.
CPC ................. *H05K 3/38* (2013.01); *C25D 3/38* (2013.01); *C25D 5/02* (2013.01); *C25D 5/34* (2013.01);
(Continued)

(58) Field of Classification Search
CPC .......... H05K 1/09; H05K 3/108; H05K 3/181; H05K 3/188
See application file for complete search history.

(56) References Cited

U.S. PATENT DOCUMENTS

2004/0262165 A1 12/2004 Kanda
2014/0076614 A1* 3/2014 Kobayashi ........... H05K 3/4682
174/251
(Continued)

FOREIGN PATENT DOCUMENTS

JP 2000-80496 A 3/2000
JP 2003-45871 A 2/2003
(Continued)

OTHER PUBLICATIONS

International Search Report for corresponding Application No. PCT/JP2019/008989, dated May 21, 2019.

*Primary Examiner* — Elizabeth E Mulvaney
(74) *Attorney, Agent, or Firm* — Renner, Otto, Boisselle & Sklar, LLP

(57) ABSTRACT

A printed circuit board according to an embodiment of the present disclosure includes a base film having an insulating property, and a conductive pattern that is stacked on at least one surface of the base film and that includes a plurality of wiring parts arranged in parallel. The plurality of wiring parts have an average width of 5 μm or more and 15 μm or less. The plurality of wiring parts have an electroless plating layer and an electroplating layer stacked on the electroless plating layer. A void density at an interface between the electroless plating layer and the electroplating layer in a section of the plurality of wiring parts in a thickness direction is 0.01 μm²/μm or less.

10 Claims, 2 Drawing Sheets

(51) Int. Cl.
*C25D 3/38* (2006.01)
*C25D 5/02* (2006.01)
*C25D 5/34* (2006.01)
*C25D 21/12* (2006.01)
*H05K 3/18* (2006.01)
*H05K 1/09* (2006.01)

(52) U.S. Cl.
CPC ............... *C25D 21/12* (2013.01); *H05K 1/09* (2013.01); *H05K 3/181* (2013.01)

(56) References Cited

U.S. PATENT DOCUMENTS

2015/0041192 A1* 2/2015 Han ................. H05K 3/108
174/268
2020/0376810 A1* 12/2020 Hashizume ............ H05K 1/056

FOREIGN PATENT DOCUMENTS

| JP | 2004-6773 A | 1/2004 |
| JP | 2004-315889 A | 11/2004 |

* cited by examiner

PRINTED CIRCUIT BOARD AND METHOD FOR MANUFACTURING PRINTED CIRCUIT BOARD

TECHNICAL FIELD

The present disclosure relates to a printed circuit board and a method for manufacturing a printed circuit board.

The present application claims priority from Japanese Patent Application No. 2018-92173 filed on May 11, 2018, and the entire contents of the Japanese patent application are incorporated herein by reference.

BACKGROUND ART

With a reduction in the size and weight of electronic devices, wiring parts of a printed circuit board have been arranged at a finer pitch. As a method for realizing such a finer pitch of wiring parts of a printed circuit board, a semi-additive method is employed. In this semi-additive method, for example, an electroless plating layer is formed on a surface of an insulating resin layer, portions of the electroless plating layer other than portions where circuits are to be formed are covered with a plating resist, and an electroplating layer is then selectively formed by electroplating only on the circuit portions. Furthermore, the plating resist is stripped, and the portions of the electroless plating layer other than the circuit portions are etched to thereby form a printed circuit board (refer to Japanese Unexamined Patent Application Publication No. 2004-6773).

CITATION LIST

Patent Literature

PTL 1: Japanese Unexamined Patent Application Publication No. 2004-6773

SUMMARY OF INVENTION

A printed circuit board according to an embodiment of the present disclosure includes a base film having an insulating property, and a conductive pattern that is stacked on at least one surface of the base film and that includes a plurality of wiring parts arranged in parallel, in which the plurality of wiring parts have an average width of 5 μm or more and 15 μm or less, the plurality of wiring parts have an electroless plating layer and an electroplating layer stacked on the electroless plating layer, and a void density at an interface between the electroless plating layer and the electroplating layer in a section of the plurality of wiring parts in a thickness direction is 0.01 $\mu m^2/\mu m$ or less.

A method for manufacturing a printed circuit board according to an embodiment of the present disclosure includes a step of forming, by a semi-additive method, a conductive pattern including a plurality of wiring parts arranged in parallel on at least one surface of a base film having an insulating property, in which the forming step includes a step of subjecting the one surface of the base film to electroless plating, a step of forming a resist pattern having an inverted shape of the plurality of wiring parts on a surface of an electroless plating layer formed in the electroless plating step, a step of subjecting surfaces of the resist pattern and the electroless plating layer after the resist pattern-forming step to plasma treatment, and a step of subjecting the surface of the electroless plating layer after the plasma treatment step to electroplating, the plurality of wiring parts have an average width of 5 μm or more and 15 μm or less, and an amount of asking of the resist pattern through the plasma treatment step is 60 nm or more and 300 nm or less.

DESCRIPTION OF EMBODIMENTS

Figure 1:
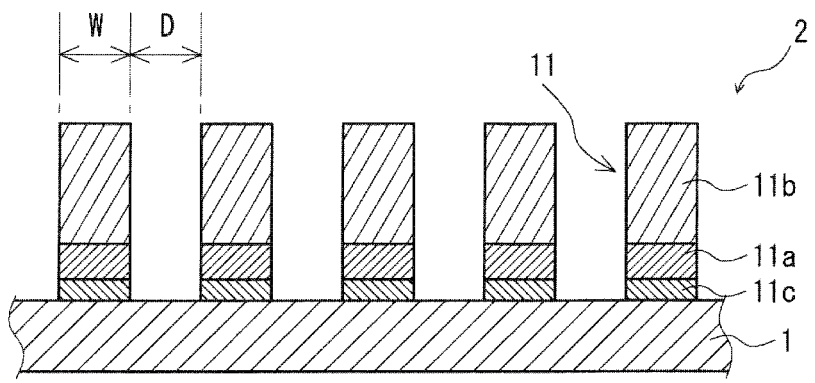
FIG. 1 is a schematic sectional view illustrating a printed circuit board according to an embodiment of the present disclosure.

Problems to be Solved by Present Disclosure

In the case where an electroplating layer is stacked on an electroless plating layer to form a wiring pattern with a fine pitch, adhesiveness between the electroless plating layer and the electroplating layer is insufficient, and interlayer separation tends to occur.

The present disclosure has been made in view of the circumstances described above. An object of the present disclosure is to provide a printed circuit board in which separation between an electroless plating layer and an electroplating layer of wiring parts can be sufficiently suppressed even when the width of each of the wiring parts is reduced, and a method for manufacturing such a printed circuit board.

Advantageous Effects of Present Disclosure

The printed circuit board according to an embodiment of the present disclosure is capable of sufficiently suppressing separation between an electroless plating layer and an electroplating layer of wiring parts even when the width of each of the wiring parts is reduced. The method for manufacturing a printed circuit board according to an embodiment of the present disclosure is capable of manufacturing a printed circuit board that can sufficiently suppress separation between an electroless plating layer and an electroplating layer of wiring parts even when the width of each of the wiring parts is reduced.

DESCRIPTION OF EMBODIMENTS OF PRESENT DISCLOSURE

First, embodiments of the present disclosure will be listed and described.

A printed circuit board according to an embodiment of the present disclosure includes a base film having an insulating property, and a conductive pattern that is stacked on at least one surface of the base film and that includes a plurality of wiring parts arranged in parallel. In the printed circuit board, the plurality of wiring parts have an average width of 5 μm or more and 15 μm or less, the plurality of wiring parts have an electroless plating layer and an electroplating layer stacked on the electroless plating layer, and a void density at an interface between the electroless plating layer and the electroplating layer in a section of the plurality of wiring parts in a thickness direction is 0.01 $\mu m^2/\mu m$ or less.

As a result of extensive studies conducted by inventors of the present disclosure, it has been found that, in a printed circuit board which includes a plurality of wiring parts having a layered structure of an electroless plating layer and an electroplating layer and in which the plurality of wiring parts have an average width within the aforementioned range, voids formed at an interface between the electroless plating layer and the electroplating layer affect the interlayer separation. In the printed circuit board, the void density at the interface between the electroless plating layer and the electroplating layer in a section of the plurality of wiring parts in the thickness direction is less than or equal to the aforementioned upper limit. Accordingly, even when the plurality of wiring parts have an average width within the aforementioned range, separation between the electroless plating layer and the electroplating layer can be sufficiently suppressed.

A maximum area of a void formed at the interface is preferably 0.01 $\mu m^2$ or less. When the maximum area of a void formed at the interface is less than or equal to the aforementioned upper limit, separation between the electroless plating layer and the electroplating layer of the plurality of wiring parts can be more reliably suppressed.

An average spacing of the plurality of wiring parts is preferably 5 μm or more and 15 μm or less. When the average spacing of the plurality of wiring parts is within the aforementioned range, realization of a finer pitch of the plurality of wiring parts can be promoted. In addition, even when the printed circuit board includes the plurality of wiring parts having an average spacing within the aforementioned range, separation between the electroless plating layer and the electroplating layer of the plurality of wiring parts can be sufficiently suppressed.

The electroless plating layer and the electroplating layer preferably contain copper as a main component. When the electroless plating layer and the electroplating layer contain copper as a main component, a conductive pattern in which interlayer separation is unlikely to occur and which has high conductivity can be formed at a low cost.

A method for manufacturing a printed circuit board according to another embodiment of the present disclosure includes a step of forming, by a semi-additive method, a conductive pattern including a plurality of wiring parts arranged in parallel on at least one surface of a base film having an insulating property. The forming step includes a step of subjecting the one surface of the base film to electroless plating, a step of forming a resist pattern having an inverted shape of the plurality of wiring parts on a surface of an electroless plating layer formed in the electroless plating step, a step of subjecting surfaces of the resist pattern and the electroless plating layer after the resist pattern-forming step to plasma treatment, and a step of subjecting the surface of the electroless plating layer after the plasma treatment step to electroplating. In the method, the plurality of wiring parts have an average width of 5 μm or more and 15 μm or less, and an amount of ashing of the resist pattern through the plasma treatment step is 60 nm or more and 300 nm or less.

The method for manufacturing a printed circuit board includes a step of subjecting surfaces of the resist pattern and the electroless plating layer after the resist pattern-forming step to plasma treatment, in which an amount of ashing of the resist pattern through this plasma treatment step is within the aforementioned range. Accordingly, voids are unlikely to be formed at the interface between the electroless plating layer and the electroplating layer. Therefore, the method for manufacturing a printed circuit board is capable of manufacturing a printed circuit board that can sufficiently suppress separation between the electroless plating layer and the electroplating layer even when the plurality of wiring parts have an average width within the aforementioned range.

An initial current density in the electroplating step is preferably 0.003 $A/m^2$ or more and 0.015 $A/m^2$ or less. When the initial current density in the electroplating step is within the aforementioned range, the crystal grain size of a plating metal in the initial stage of the electroplating is increased to suppress recrystallization of this plating metal. Thus, formation of voids at the interface with the electroless plating layer can be suppressed.

In the present disclosure, the term "parallel" refers to that an angle formed by two parts is 5° or less, and preferably 3° or less. The term "width" of a wiring part refers to a value determined by averaging, in a longitudinal direction of a wiring part, the maximum width in a section of the wiring part taken perpendicular to the longitudinal direction. The term "spacing" of wiring parts refers to a value determined by averaging the minimum distance between side edges of adjacent wiring parts, the side edges facing each other, in a longitudinal direction of the wiring parts. The terms "average width" and "average spacing" refer to values determined by averaging the "width" and the "spacing", respectively, measured for a plurality of wiring parts. The term "main component" refers to a component having the highest content on a mass basis, and, for example, a component having a content of 50% by mass or more. The term "initial current density in an electroplating step" refers to an average value of a current density for a time corresponding to the first 3% to 20% of the total plating time of an electroplating step. The term "amount of ashing of a resist pattern" means, when a portion of the surface of a resist pattern is covered with a tape having ashing resistance, and the resist pattern is ached, the difference in height between a surface of the resist pattern in a region covered with the tape and a surface of the resist pattern in a region that is not covered with the tape, and refers to a value calculated as an average value at five random points.

Details of Embodiments of Present Disclosure

Hereafter, a printed circuit board and a method for manufacturing a printed circuit board according to embodiments of the present disclosure will be described in detail with reference to the drawings.

Printed Circuit Board

A printed circuit board in FIG. 1 includes a base film 1 having an insulating property and a conductive pattern 2 that is stacked on one surface of the base film 1 and that includes a plurality of wiring parts 11 arranged in parallel. The wiring parts 11 have an electroless plating layer 11a and an electroplating layer 11b stacked on the electroless plating layer 11a. The wiring parts 11 further have a seed layer 11c stacked on a surface of the electroless plating layer 11a on the side opposite to the side where the electroplating layer 11b is stacked. An average width W of the plurality of wiring parts 11 is 5 µm or more and 15 µm or less. In the printed circuit board, a void density at an interface between the electroless plating layer 11a and the electroplating layer 11b in a section of the plurality of wiring parts 11 in a thickness direction is 0.01 µm²/µm or less.

As a result of extensive studies conducted by the inventors of the present disclosure, it has been found that, in the printed circuit board which includes the wiring parts 11 having a layered structure of the electroless plating layer 11a and the electroplating layer 11b and in which the plurality of wiling parts 11 have an average width W within the aforementioned range, voids formed at the interface between the electroless plating layer 11a and the electroplating layer 11b affect the interlayer separation. In the printed circuit board, the void density at the interface between the electroless plating layer 11a and the electroplating layer 11b in a section of the plurality of wiring parts 11 in the thickness direction is less than or equal to the aforementioned upper limit. Accordingly, even when the plurality of wiring parts 11 have an average width W within the aforementioned range, separation between the electroless plating layer 11a and the electroplating layer 11b can be sufficiently suppressed.

Base Film

The base film 1 contains a synthetic resin as a main component and has electrical insulation properties. The base film 1 is a base material layer for forming the conductive pattern 2. The base film 1 may have flexibility. When the base film 1 has flexibility, the printed circuit board is used as a flexible printed circuit board.

Examples of the synthetic resin include polyimides, polyethylene terephthalate, liquid crystal polymers, and fluororesins.

In the case where the printed circuit board is a flexible printed circuit board, the lower limit of the average thickness of the base film 1 is preferably 5 µm, and more preferably 10 µm. On the other hand, the upper limit of the average thickness of the base film 1 is preferably 50 µm, and more preferably 40 µm. When the average thickness of the base film 1 is less than the lower limit, the insulation strength of the base film 1 may become insufficient. Conversely, when the average thickness of the base film 1 exceeds the upper limit, the printed circuit board may have an unnecessarily large thickness or flexibility may become insufficient.

Conductive Pattern

The conductive pattern 2 is a layer formed of a material having conductivity and includes a plurality of wiring parts 11 that are arranged on one surface of the base film 1 in parallel in plan view. The plurality of wiring parts 11 are, for example, wiring lines that form a coil pattern. The conductive pattern 2 may include a pattern other than the wiring parts 11, for example, a pattern of land parts or the like.

The conductive pattern 2 has a seed layer 11c stacked on the one surface of the base film 1, an electroless plating layer 11a stacked on one surface of the seed layer 11c (a surface opposite to the stacking surface on the base film 1), and an electroplating layer 11b stacked on one surface of the electroless plating layer 11a (a surface opposite to the stacking surface on the seed layer 11c). The seed layer 11c, the electroless plating layer 11a, and the electroplating layer 11b are directly stacked in this order without other layers therebetween. The conductive pattern 2 is a three-layer structure of the seed layer 11c, the electroless plating layer 11a, and the electroplating layer 11b.

Seed Layer

The seed layer 11e is a metal layer for forming plating, the metal layer being used for subjecting one surface of the base film 1 to electroplating. Examples of the method for stacking the seed layer 11c on one surface of the base film 1 include, but are not particularly limited to, publicly known methods such as vapor deposition and sputtering. Alternatively, the seed layer 11c may be a sintered layer of metal particles, the layer being formed by applying an ink including metal particles to one surface of the base film 1, and sintering the metal particles. Examples of the main component of the seed layer 11c include nickel, gold, silver, tungsten, molybdenum, copper, tin, cobalt, chromium, iron, and zinc. Of these, copper, which has high adhesiveness to the base film 1 and is suitable as a plating start surface, is preferred. The average thickness of the seed layer 11a can be, for example, 10 nm or more and 2 µm or less from the viewpoint of increasing the efficiency of removal by etching while preventing the generation of a gap in the planar direction.

Electroless Plating Layer

The electroless plating layer 11a is formed by electroless plating. Examples of the main component of the electroless plating layer 11a include copper, nickel, and silver. Of these, preferred is copper, which has high conductivity, is relatively cheap, and achieves high adhesiveness to the seed layer 11e in the case where the main component of the seed layer 11c is copper. The average thickness of the electroless plating layer 11a can be, for example, 50 nm or more and 2 µm or less from the viewpoint of sufficiently covering the surface of the seed layer 11c and suppressing a reduction in productivity caused by an increase in the time necessary for electroless plating.

Electroplating Layer

The electroplating layer 11b is formed by electroplating. Examples of the main component of the electroplating layer 11b include copper, nickel, and silver. Of these, preferred is copper, which has high conductivity, is relatively cheap, and achieves high adhesiveness to the electroless plating layer 11a in the case where the main component of the electroless plating layer 11a is copper. In the case where the main component of the electroplating layer 11b is copper, the electroplating layer 11b is preferably formed by electroplating using a copper sulfate plating bath that includes an additive from the viewpoint that, for example, the cost is relatively low, and the thickness of the layer is easily adjusted. In the printed circuit board, a surface of the electroless plating layer 11a on the side where the electroplating layer 11b is to be stacked is subjected to plasma treatment, as described below. With this treatment, in the minted circuit board, contaminants such as organic substances adhering to the surface of the electroless plating layer 11a as a result of electroless plating are removed. Furthermore, in the printed circuit board, the initial current density during electroplating is suppressed, as described below. Accordingly, in the printed circuit board, presumably, the crystal grain size of a plating metal in the initial stage of the electroplating is increased to suppress recrystallization of the plating metal, and thus generation of voids due to the additive is easily suppressed. Therefore, in the printed circuit board, even when electroplating is performed by using a copper sulfate plating bath that includes an additive, generation of voids at the interface between the electroless plating layer 11a and the electroplating layer 11b can be sufficiently suppressed.

The average thickness of the electroplating layer 11b is determined in accordance with the type of printed circuit to be produced and is not particularly limited. The average thickness of the electroplating layer 11b can be, for example, 1 μm or more and 100 μm or less.

Wiring Parts

The plurality of wiring parts 11 are formed linearly so as to have substantially the same shape. The plurality of wiring parts 11 each have a small width and are arranged at a narrow pitch. In other words, the plurality of wiring parts 11 are arranged at a fine pitch.

The lower limit of the average width W of the plurality of wiring parts 11 is 5 μm as described above, and more preferably 8 μm. On the other hand, the upper limit of the average width W of the plurality of wiring parts 11 is 15 μm as described above, and more preferably 12 μm. When the average width W is less than the lower limit, the manufacturing of the plurality of wiring parts 11 may become difficult. Conversely, when the average width W exceeds the upper limit, it may become difficult to achieve a desired wiring density. In contrast, when the average width W is within the aforementioned range, in an existing printed circuit board, separation is highly likely to occur at the interface between an electroless plating layer and an electroplating layer; however, in the present printed circuit board, separation between the electroless plating layer 11a and the electroplating layer 11b can be sufficiently suppressed by sufficiency suppressing generation of voids at the interface between the electroless plating layer 11a and the electroplating layer 11b.

The lower limit of an average spacing D of the plurality of wiring parts 11 is preferably 5 μm, and more preferably 8 μm. On the other hand, the upper limit of the average spacing D of the plurality of wiring parts 11 is preferably 15 μm, and more preferably 12 μm. When the average spacing D is less than the lower limit, the manufacturing of the plurality of wiring parts 11 may become difficult. Conversely, when the average spacing D exceeds the upper limit, it may become difficult to achieve a desired wiring density.

The lower limit of a ratio (W/D) of the average width W to the average spacing D of the plurality of wiring parts 11 is preferably 0.3, and more preferably 0.8. On the other hand, the upper limit of W/D is preferably 3.0, and more preferably 1.5. When W/D is less than the lower limit, the average spacing D of the plurality of wiring parts 11 becomes unnecessarily large and it may become difficult to achieve a desired wiring density, or the average width W of the plurality of wiring parts 11 becomes small and the resulting circuit may tend to be separated. Conversely, when W/D exceeds the upper limit, the average width W of the plurality of wiring parts 11 becomes unnecessarily large and it may become difficult to achieve a desired wiring density, or the average spacing D of the plurality of wiring parts 11 becomes small and a resist pattern may tend to be separated during the formation of the plurality of wiring parts 11.

The upper limit of the void density at the interface between the electroless plating layer 11a and the electroplating layer 11b is 0.01 μm/μm as described above, and preferably 0.005 μm$^2$/μm, and more preferably 0.002 μm$^2$/μm. When the void density exceeds the upper limit, separation between the electroless plating layer 11a and the electroplating layer 11b may not be sufficiently suppressed. On the other hand, the void density is preferably low, and the lower limit of the void density can be 0 μm$^2$/μm. The voids at the interface between the electroless plating layer 11a and the electroplating layer 11b can be determined by taking a sectional photograph of the wiring parts 11 in the thickness direction with an electron microscope such as a scanning electron microscope (SEM), and binarizing the sectional photograph by using image processing software such as GNU Image Manipulation Program such that voids are shown in black. Furthermore, the void density at the interface between the electroless plating layer 11a and the electroplating layer 11b can be determined by calculating the proportion of black from a histogram of brightness obtained by using the image processing software. More specifically, first, sectional photographs of the wiring parts 11 in the thickness direction are taken at 10 random points with the electron microscope. A region of the interface between the electroless plating layer 11a and the electroplating layer 11b, the region having a predetermined length, is cut out from each of the sectional photographs. In each of the sectional photographs, the area of a void present per unit length (μm) of the interface is measured, and the void density is calculated. Subsequently the average value of the void density of the sectional photographs at the 10 points is calculated. This average value can be defined as the void density at the interface between the electroless plating layer 11a and the electroplating layer 11b.

The upper limit of the maximum area of a void formed at the interface between the electroless plating layer 11a and the electroplating layer 11b is preferably 0.01 μm$^2$, more preferably 0.005 μm$^2$, and still more preferably 0.003 μm$^2$. When the maximum area exceeds the upper limit, separation between the electroless plating layer 11a and the electroplating layer 11b may not be sufficiently suppressed. On the other hand, preferably, the void is not present. In this case, the maximum area is 0 μm$^2$.

In the case where a plurality of voids are formed at the interface between the electroless plating layer 11a and the electroplating layer 11b, adjacent voids are preferably not connected to each other. In other words, a continuous void is preferably not formed between the electroless plating layer 11a and the electroplating layer 11b. When adjacent voids are not connected to each other, interlayer separation between the electroless plating layer 11a and the electroplating layer 11b can be more reliably suppressed. In the case where a plurality of voids are formed at the interface between the electroless plating layer 11a and the electroplating layer 11b, the upper limit of the ratio of presence of continuous voids to all the voids per unit length (μm) is preferably 10%, and more preferably 5%. When the ratio of presence exceeds the upper limit, separation between the electroless plating layer 11a and the electroplating layer 11b may not be sufficiently suppressed. On the other hand, the ratio of presence is preferably low, and the lower limit of the ratio of presence can be 0%. The ratio of presence of continuous voids to all the voids per unit length (μm) can be measured by the following method. First, sectional photographs of the wiring parts 11 in the thickness direction are taken at 10 random points with the electron microscope such as an SEM. A region of the interface between the electroless plating layer 11a and the electroplating layer 11b, the region having a predetermined length, is cut out from each of the sectional photographs. In each of the sectional photographs, the ratio of presence of continuous voids per unit length (μm) is calculated. Subsequently, the average value of the ratio of presence of continuous voids in the sectional photographs at the 10 points is calculated. This average value is defined as the ratio of presence of continuous voids to all the voids per unit length (μm).

Method for Manufacturing Printed Circuit Board

Next, an example of a method for manufacturing the printed circuit board in FIG. 1 will be described with reference to FIGS. 2A to 2F.

The method for manufacturing the printed circuit board includes a step of forming, by a semi-additive method, a conductive pattern 2 including a plurality of wiring parts 11 arranged in parallel on one surface of a base film 1 having an insulating property (forming step). The forming step includes a step of subjecting the one surface of the base film 1 to electroless plating (electroless plating step), a step of forming a resist pattern R having an inverted shape of a plurality of wiring parts 11 on a surface of an electroless plating layer 11a formed in the electroless plating step (resist pattern-forming step), a step of subjecting surfaces of the resist pattern R and the electroless plating layer 11a after the resist pattern-forming step to plasma treatment (plasma treatment step), and a step of subjecting the surface of the electroless plating layer 11a after the plasma treatment step to electroplating (electroplating step). In addition, the forming step includes, before the electroless plating step, a step of stacking a seed layer 11c on substantially the entirety of the one surface of the base film 1 (seed layer-stacking step), and, after the electroplating step, a step of removing the resist pattern R formed in the resist pattern-forming step and portions of the seed layer 11c and the electroless plating layer 11a, the portions overlapping the resist pattern R in plan view (removal step). The plurality of wiring parts 11 have an average width of 5 μm or more and 15 μm or less. The amount of ashing of the resist pattern R through the plasma treatment step is 60 nm or more and 300 nm or less.

In the forming step, first, a seed layer 11c and an electroless plating layer 11a are stacked in this order on substantially the entirety of one surface of a base film 1, and a resist pattern R having an inverted shape of a plurality of wiring parts 11 is formed on a surface of the electroless plating layer 11a. Subsequently, surfaces of the resist pattern R. and the electroless plating layer 11a after the resist pattern-forming step are subjected to plasma treatment to remove contaminants such as organic substances adhering to the surface of the electroless plating layer 11a. Next, an electroplating layer 11b is stacked in regions of the surface of the electroless plating layer 11a after the plasma treatment, the regions not having the resist pattern R thereon. Subsequently, the resist pattern R and portions of the seed layer 11c and the electroless plating layer 11a, the portions overlapping the resist pattern R in plan view, are removed to manufacture the plurality of wiring parts 11.

The method for manufacturing the printed circuit board includes the plasma treatment step in which the surfaces of the resist pattern R and the electroless plating layer 11a after the resist pattern-forming step are subjected to plasma treatment in the aforementioned amount of ashing. Accordingly, voids are unlikely to be formed at the interface between the electroless plating layer 11a and the electroplating layer 11b. Therefore, the method for manufacturing the printed circuit board is capable of manufacturing the printed circuit board in FIG. 1 that can sufficiently suppress separation between the electroless plating layer 11a and the electroplating layer 11b even when the plurality of wiring parts 11 have an average width within the aforementioned range.

Seed Layer-Stacking Step

Figure 2A:
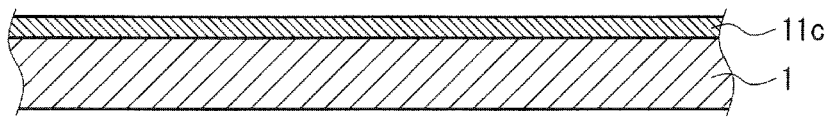
FIG. 2A is a schematic view illustrating a seed layer-stacking step in a method for manufacturing the printed circuit board in FIG. 1.

In the seed layer-stacking step, as illustrated in FIG. 2A, a seed layer 11c (metal layer) for forming plating, the seed layer 11c being used for subjecting substantially the entirety of one surface of the base film 1 to electroplating, is stacked. Examples of the method for stacking the seed layer 11c in the seed layer-stacking step include, but are not particularly limited to, vapor deposition and sputtering. Alternatively, in the seed layer-stacking step, an ink including metal particles may be applied to substantially the entirety of one surface of the base film 1, and the metal particles may be sintered to stack a sintered layer of the metal particles on the one surface of the base film 1. Examples of the main component of the seed layer 11c include nickel, gold, silver, tungsten, molybdenum, copper, tin, cobalt, chromium, iron, and zinc. Of these, copper, which has high adhesiveness to the base film 1 and is suitable as a plating start surface, is preferred.

Electroless Plating Step

Figure 2B:
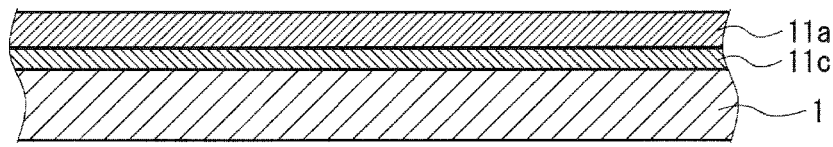
FIG. 2B is a schematic view illustrating an electroless plating step in the method for manufacturing the printed circuit board in FIG. 1.

In the electroless plating step, as illustrated in FIG. 2B, an electroless plating layer 11a is stacked on substantially the entirety of a surface of the seed layer 11c stacked in the seed layer-stacking step. Examples of the metal used in the electroless plating step include copper, nickel, and silver. Of these, preferred is copper, which has high conductivity, is relatively cheap, and achieves high adhesiveness to the seed layer 11c in the case where the main component of the seed layer 11c is copper.

Resist Pattern-Forming Step

In the resist pattern-forming step, first, a photoresist film is stacked on substantially the entirety of a surface of the electroless plating layer 11a stacked in the electroless plating step. This photoresist film is formed of a negative resist composition in which bonding of a polymer is strengthened by exposure with light to thereby decrease the solubility in a developing solution or a positive resist composition in which bonding of a polymer is weakened by exposure with light to thereby increase the solubility in a developing solution.

In the resist pattern-forming step, the photoresist film is formed on the surface of the electroless plating layer 11a by, for example, coating and drying of a liquid resist composition or thermocompression bonding of a dry film resist that does not have fluidity at room temperature. In particular, a positive liquid resist composition is preferably used in the resist pattern-forming step from the viewpoint that the amount of aching is easily stabilized, and an amount of etching in the plasma treatment step described below is easily controlled by controlling this amount of ashing.

Figure 2C:
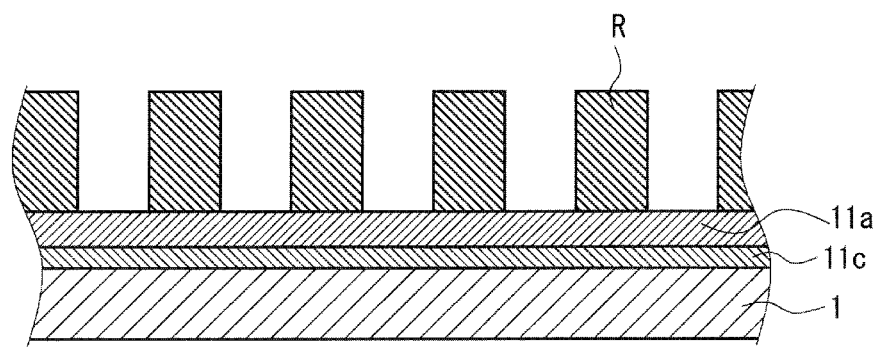
FIG. 2C is a schematic view illustrating a resist pattern-forming step in the method for manufacturing the printed circuit board in FIG. 1.

Next, in the resist pattern-forming step, the photoresist film is selectively exposed with light by using, for example, a photomask so that portions that dissolve in a developing solution and portions that do not dissolve in the developing solution are formed in the photoresist film. Subsequently, the portions of the photoresist film having high solubility are washed away by using a developing solution to thereby form a resist pattern R having openings corresponding to regions where a plurality of wiring parts 11 are to be formed, as illustrated in FIG. 2C.

Plasma Treatment Step

Figure 2D:
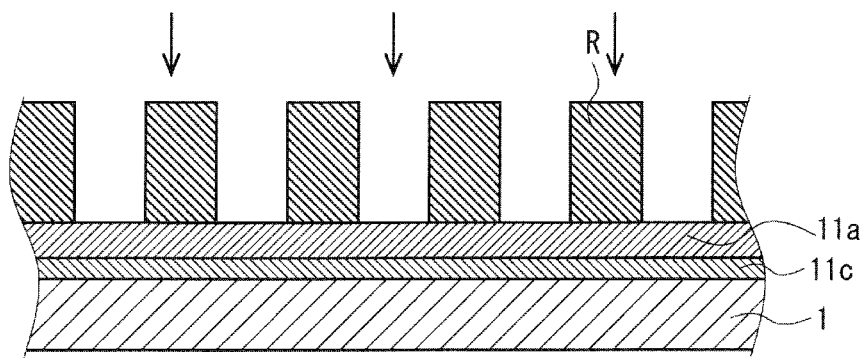
FIG. 2D is a schematic view illustrating a plasma treatment step in the method for manufacturing the printed circuit board in FIG. 1.

In the plasma treatment step, as illustrated in FIG. 2D, the surfaces of the resist pattern R and the electroless plating layer 11a after the resist pattern-forming step are brought into contact with plasma to perform etching. This treatment removes contaminants of organic substances adhering to the surface of the electroless plating layer 11a. In the method for manufacturing the printed circuit board, since the contaminants of organic substances adhering to the surface of the electroless plating layer 11a are removed in the plasma treatment step, generation of voids at the interface between an electroplating layer 11b and the electroless plating layer 11a is suppressed when the electroplating layer 11b is stacked on the electroless plating layer 11a in the electroplating step described below.

Examples of a treatment gas used in the plasma treatment in the plasma treatment step include oxygen, nitrogen, air, and fluorine-containing gases. These gases may be used alone or as a mixture of two or more thereof. In particular, the treatment gas preferably includes a fluorine-containing gas from the viewpoint of the ashing rate. More specifically, a mixed gas of oxygen, nitrogen, and a fluorine-containing gas is preferred, and a mixed gas of oxygen, nitrogen, and tetrafluoromethane is more preferred.

The lower limit of the amount of ashing of the resist pattern R in the plasma step is 60 nm as described above, and preferably 80 nm. On the other hand, the upper limit of the amount of ashing is 300 nm as described above, and preferably 200 nm. When the amount of ashing is less than the lower limit, contaminants on the surface of the electroless plating layer 11a may not be sufficiently removed, and generation of voids at the interface between the electroless plating layer 11a and the electroplating layer 11b may not be sufficiently suppressed. Conversely, when the amount of ashing exceeds the upper limit, the plasma treatment time may become unnecessarily long and the manufacturing cost may be increased, or, for example, burning or scratches may be formed on the surface of the electroless plating layer 11a.

The lower limit of the plasma treatment time (plasma irradiation time) of the plasma treatment step is preferably 25 seconds, and more preferably 30 seconds. On the other hand, the upper limit of the plasma treatment time is preferably 60 seconds, and more preferably 40 seconds. When the plasma treatment time is less than the lower limit, the amount of ashing of the resist pattern R may become insufficient, and contaminants on the surface of the electroless plating layer 22a may not be sufficiently removed. Conversely, when the plasma treatment time exceeds the upper limit, the plasma treatment time becomes unnecessarily long and the manufacturing cost may be increased, or, for example, burning or scratches may be formed on the surface of the electroless plating layer 11a.

The lower limit of the plasma output in the plasma treatment is preferably 400 W, and more preferably 500 W. On the other hand, the upper limit of the plasma output is preferably 1,000 W, and more preferably 800 W. When the plasma output is less than the lower limit, the amount of ashing of the resist pattern R may become insufficient, and contaminants on the surface of the electroless plating layer 11a may not be sufficiently removed. Conversely, when the plasma output exceeds the upper limit, the manufacturing cost may be increased, or, for example, burning or scratches may be formed on the surface of the electroless plating layer 11a.

Electroplating Step

Figure 2E:
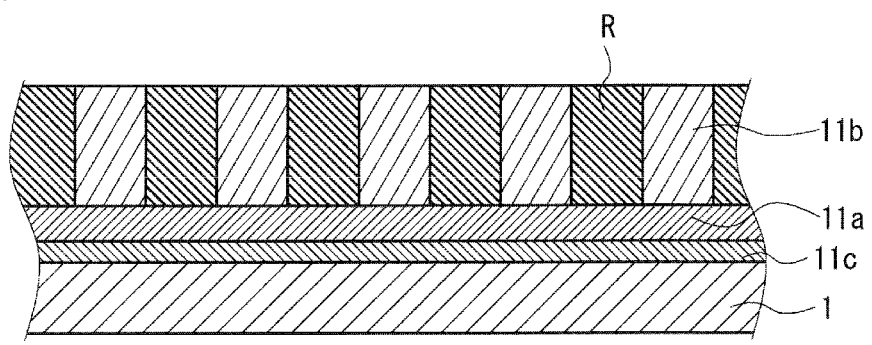
FIG. 2E is a schematic view illustrating an electroplating step in the method for manufacturing the printed circuit board in FIG. 1.

In the electroplating step, as illustrated in FIG. 2E, an electroplating layer 11b is stacked on the surface of the electroless plating layer 11a that has been subjected to the plasma treatment through the plasma treatment step. In the electroplating step, the electroplating layer 11b is stacked in regions of the surface of the electroless plating layer 11a, the regions not having the resist pattern R thereon (regions corresponding to the openings of the resist pattern R).

Examples of the metal used in the electroplating step include copper, nickel, and silver. Of these, preferred is copper, which has high conductivity, is relatively cheap, and achieves high adhesiveness to the electroless plating layer 11a in the case where the main component of the electroless plating layer 11a is copper. In the case where the metal used in the electroplating step is copper, electroplating using a copper sulfate plating bath that includes an additive is preferably performed in the electroplating step from the viewpoint that, for example, the cost is relatively low, and the thickness of the electroplating layer 11b is easily adjusted. In general, a large number of microvoids are present in a copper sulfate plating bath that includes an additive, and very large voids derived from the microvoids are easily formed during the recrystallization process of the plating metal. However, in the method for manufacturing the printed circuit board, recrystallization of the plating metal can be suppressed by reducing the initial current density in the electroplating step, as described below, and thus formation of very large voids derived from the microvoids can be sufficiently suppressed.

The lower limit of the initial current density in the electroplating step is preferably 0.003 A/m$^2$, and more preferably 0.005 A/m$^2$. On the other hand, the upper limit of the initial current density is preferably 0.015 A/m$^2$, and more preferably 0.012 A/m$^2$. When the initial current density is less than the lower limit, the thickness of a layer having a large crystal grain size may become small, recrystallization of the plating metal may not be sufficiently suppressed, and the effect of reducing voids may become insufficient. Furthermore, when the initial current density is less than the lower limit, it may take a long time to obtain a predetermined thickness, and productivity may decrease. Conversely, when the initial current density exceeds the upper limit, the crystal grain size of the plating metal in the initial stage of the electroplating may become insufficient, recrystallization of this plating metal may be accelerated, and voids are easily formed at the interface with the electroless plating layer 11a, or it may become difficult to form the electroplating layer 11b so as to have a uniform thickness.

The void density, the maximum area of a void, and the ratio of presence of continuous voids to all the voids per unit length (μm) at the interface between the electroless plating layer 11a and the electroplating layer 11b after the electroplating step are respectively same as the void density, the maximum area of a void, and the ratio of presence of continuous voids to all the voids per unit length (μm) at the interface between the electroless plating layer 11a and the electroplating layer 11b in the printed circuit board in FIG. 1.

Removal Step

Figure 2F:
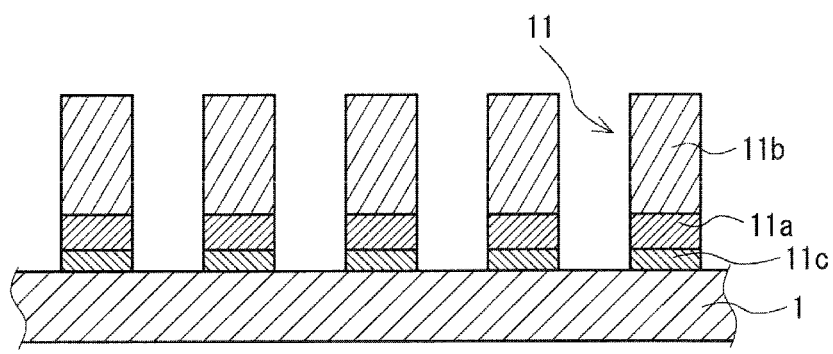
FIG. 2F is a schematic view illustrating a removal step in the method for manufacturing the printed circuit board in FIG. 1.

In the removal step, as illustrated in FIG. 2F, the resist pattern R and portions of the seed layer 11c and the electroless plating layer 11a, the portions overlapping the resist pattern R in plan view, are removed after the electroplating step.

In the removal step, first, the resist pattern R is removed by stripping the resist pattern R from the electroless plating layer 11a. Specifically, a multilayer body after the electroplating step, the multilayer body including the base film 1, the seed layer 11c, the electroless plating layer 11a, the electroplating layer 11b, and the resist pattern R, is immersed in a stripping solution to swell the resist pattern R with the stripping solution. As a result, a repulsive force is generated between the resist pattern R and the electroless plating layer 11a, and the resist pattern R is stripped from the electroless plating layer 11a. The stripping solution used may be a publicly known stripping solution.

Next, in the removal step, exposed portions of the electroless plating layer 11a exposed by stripping of the resist pattern R and the seed layer 11c overlapping the exposed portions are removed by etching. For the etching, an etchant that erodes metals forming the seed layer 11c and the electroless plating layer 11a is used. As a result of this removal of the seed layer 11c and the electroless plating layer 11a, a plurality of wiring parts 11 are formed on the one surface of the base film 1. In the method for manufacturing the printed circuit board, since the generation of voids at the interface between the electroless plating layer 11a and the electroplating layer 11b is suppressed as described above, for example, the stripping solution and the etchant used in the removal step are unlikely to permeate through the interface between the electroless plating layer 11a and the electroplating layer 11b. Accordingly, in the method for manufacturing the printed circuit board, separation of the electroplating layer 11b from the surface of the electroless plating layer 11a due to, for example, the stripping solution and the etchant is unlikely to occur even in the case of forming wiring parts 11 arranged at a fine pitch.

Other Embodiments

It is to be understood that the embodiments disclosed herein are only illustrative and non-restrictive in all respects. The scope of the present invention is not limited to the configurations of the embodiments and is defined by the claims described below. The scope of the present invention is intended to cover all modifications within the meaning and the scope of equivalents of the claims.

For example, in the above embodiments, a configuration in which a conductive pattern is stacked on one surface of a base film has been described. Alternatively, in the printed circuit board, a pair of conductive patterns may be stacked on both surfaces of a base film. In the method for manufacturing a printed circuit board, a pair of conductive patterns may be formed on both surfaces of a base film.

The wiring parts need not necessarily have a seed layer. For example, the wiring parts may have an electroless plating layer that is directly stacked on one surface of a base film and an electroplating layer stacked on the electroless plating layer. Alternatively, even in the case where the wiring parts have the seed layer, the seed layer may be stacked on one surface of a base film by using an adhesive.

EXAMPLES

Hereafter, the present invention will be described in more detail by way of Examples; however, the present invention is not limited to these Examples.

[No. 1]

A base film formed of a polyimide film ("APICAL (registered trademark) NPI" manufactured by Kaneka Corporation) having an average thickness of 25 μm was prepared. A conductive pattern including a plurality of (1,000) wiring parts arranged in parallel was formed on one surface of the base film by the semi-additive method. Specifically, first, a copper nanoparticle dispersion liquid including copper nanoparticles dispersed in water was applied to one surface of the base film, and sintering was performed to thereby stack, on the one surface of the base film, a seed layer formed of a sintered body of the copper nanoparticles and having an average thickness of 0.3 μm (seed layer-stacking step). Next, substantially the entirety of the surface of the seed layer stacked in the seed layer-stacking step was subjected to electroless copper plating to stack an electroless plating layer having an average thickness of 0.25 μm (electroless plating step). Subsequently, a photoresist film was stacked on substantially the entirety of the surface of the electroless plating layer by thermocompression bonding of an acrylic dry film resist. The photoresist film was then selectively exposed with light by using a photomask to form, in the photoresist film, portions that dissolve in a developing solution and portions that do not dissolve in the developing solution. The portions of the photoresist film having high solubility were washed away by using a developing solution to thereby form a resist pattern having openings corresponding to regions where a plurality of wiring parts were to be formed (resist pattern-forming step).

Subsequently, the surfaces of the resist pattern formed in the resist pattern-forming step and the electroless plating layer exposed from the openings of the resist pattern were subjected to plasma treatment by using a vacuum plasma apparatus manufactured by Top Range Machinery Co., Ltd. under the conditions described below (plasma treatment step).

Plasma method: microwave plasma
Gas: mixed gas of $O_2$, $CF_4$, and $N_2$
Gas flow rate: $O_2$:$CF_4$:$N_2$=2,000 mL/L:200 mL/L:2 mL/L
Pressure in chamber: 80 Pa
Plasma output: 500 W
Plasma treatment time: 30 seconds In the plasma treatment step, a portion of the surface of the resist pattern was covered with a tape having ashing resistance, and ashing of the resist pattern was performed. The difference in height between a surface of the resist pattern in a region covered with the tape and a surface of the resist pattern in a region that was not covered with the tape was measured at five random points. The average value of the measurement values was calculated to determine the amount [nm] of ashing of the resist pattern through the plasma treatment step. Table 1 shows the measurement result.

Next, the surface of the electroless plating layer after the plasma treatment step was subjected to copper electroplating to stack an electroplating layer having an average thickness of 10 μm (electroplating step).

The electroplating was performed under the conditions described below.

Composition of plating bath: copper sulfate pentahydrate 100 g/L, sulfuric acid 180 g/L, chlorine 50 mg/L, additives (RF-MU (manufactured by JCU Corporation) 10 mL/L and RF-B (manufactured by JCU Corporation) 0.75 mL/L)

Initial current density: 0.005 A/m$^2$
Plating bath temperature: 25° C.
Anode: insoluble anode Next, after the electroplating step, the resist pattern was removed by using a stripping solution. Furthermore, exposed portions of the electroless plating layer exposed by stripping of the resist pattern and the seed layer overlapping the exposed portions were removed by etching (removal step) to manufacture a printed circuit board of No. 1. Table 1 shows the average width and the average spacing of the plurality of wiring parts of the printed circuit board of No. 1.

Void Density

Figure 3:
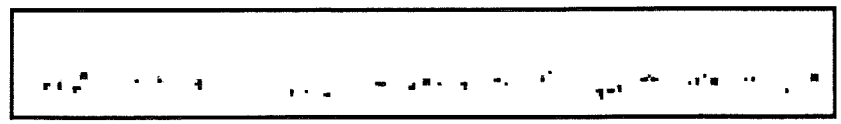
FIG. 3 is a binarized image of an interface between an electroless plating layer and an electroplating layer in a sectional photograph of wiring parts of a printed circuit board of No. 1 in a thickness direction.

Sectional photographs of the wiring parts of the printed circuit board in the thickness direction were taken at 10 random points by using a scanning electron microscope (SEM). A region of the interface between the electroless plating layer and the electroplating layer, the region having a length of 4 μm, was cut out from each of the sectional photographs and binarized by using GNU Image Manipulation Program such that voids were shown in black. Furthermore, the target pixels were counted in the resulting histogram of brightness to calculate the void density [μm$^2$/μm] in each of the sectional photographs. Furthermore, the average value of the void density of the sectional photographs at the 10 points was calculated to determine the void density of No. 1. Table 1 shows the void density. FIG. 3 shows a binarized image of the interface between the electroless plating layer and the electroplating layer of No. 1.

Maximum Area of Void

The maximum area [μ$^2$] of a void in the sectional photographs at the 10 points was determined. Table 1 shows the maximum area of the void. In Examples, when a plurality of voids were continuous with each other to form a single continuous void, the area of this continuous void was defined as a single void area.

[Nos. 2 to 6]

Figure 4:
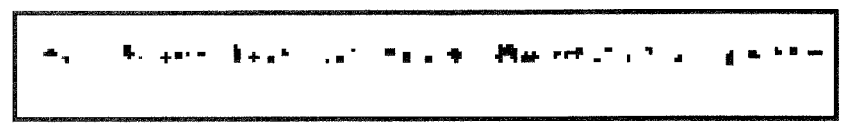
FIG. 4 is a binarized image of an interface between an electroless plating layer and an electroplating layer in a sectional photograph of wiring parts of a printed circuit board of No. 2 in a thickness direction.

Printed circuit boards of Nos. 2 to 6 were manufactured as in No. 1 except that the plasma treatment time in the plasma treatment step, the initial current density in the electroplating step, and the average width and the average spacing of the plurality of wiring parts were as shown in Table 1. Table 1 shows the amount of ashing of the resist pattern, the void density, and the maximum area of a void in each of Nos. 2 to 6. FIG. 4 shows a binarized image of the interface between the electroless plating layer and the electroplating layer of No. 2.

[No. 7]

A printed circuit board of No. 7 was manufactured as in No. 2 except that the gas flow rate and the plasma output in the plasma treatment step were as described below. Table 1 shows the amount of ashing of the resist pattern, the void density, and the maximum area of a void in No. 7.

Gas flow rate: O$_2$:CF$_4$:N$_2$=1,900 mL/L:300 mL/L:2 mL/L
Plasma output: 800 W

[No. 8]

Figure 5:
FIG. 5 is a binarized image of an interface between an electroless plating layer and an electroplating layer in a sectional photograph of wiring parts of a printed circuit board of No. 8 in a thickness direction.

A printed circuit board of No. 8 was manufactured as in No. 1 except that the plasma treatment time in the plasma treatment step, the initial current density in the electroplating step, and the average width and the average spacing of the plurality of wiring parts were as shown in Table 1. Table 1 shows the amount of ashing of the resist pattern, the void density, and the maximum area of a void in No. 8. FIG. 5 shows a binarized image of the interface between the electroless plating layer and the electroplating layer of No. 8.

[No. 9]

A printed circuit board of No. 9 was manufactured as in No. 2 except that the gas flow rate and the plasma output in the plasma treatment step were as described below. Table 1 shows the amount of ashing of the resist pattern, the void density, and the maximum area of a void in No. 9.

Gas flow rate: O$_2$:CF$_4$:N$_2$=1,900 mL/L:300 mL/L:2 mL/L
Plasma output: 1,100 W

[No. 10]

A printed circuit board of No. 10 was manufactured as in No. 1 except that the surface of the electroless plating layer was subjected to alkali treatment instead of the plasma treatment step. The alkali treatment was performed by bringing the surface of the electroless plating layer into contact with an aqueous sodium hydroxide solution having a concentration of 20 g/L, for one minute in an environment at 40° C. Table 1 shows the void density and the maximum area of a void in No. 10.

REFERENCE EXAMPLE

[No. 11]

A printed circuit board of No. 11 was manufactured as in No. 1 except that the plasma treatment time in the plasma treatment step, the initial current density in the electroplating step, and the average width and the average spacing of the plurality of wiring parts were as shown in Table 1. Table 1 shows the amount of ashing of the resist pattern, the void density, and the maximum area of a void in No. 11.

TABLE 1

| | Wiring parts | | | | Plasma treatment step | | Electroplating step |
|---|---|---|---|---|---|---|---|
| | Average width [μm] | Average spacing [μm] | Void density [μm$^2$/μm] | Maximum area of void [μm$^2$] | Plasma treatment time [sec] | Amount of ashing [nm] | Initial current density [A/m$^2$] |
| No. 1 | 10 | 10 | 0.002 | 0.002 | 30 | 80 | 0.005 |
| No. 2 | 10 | 10 | 0.008 | 0.004 | 30 | 80 | 0.010 |
| No. 3 | 5 | 15 | 0.005 | 0.004 | 30 | 80 | 0.005 |
| No. 4 | 5 | 15 | 0.009 | 0.006 | 30 | 80 | 0.010 |
| No. 5 | 15 | 5 | 0.001 | 0.001 | 30 | 80 | 0.005 |
| No. 6 | 15 | 5 | 0.003 | 0.002 | 30 | 80 | 0.010 |
| No. 7 | 10 | 10 | 0.002 | 0.002 | 30 | 300 | 0.010 |

TABLE 1-continued

| | Wiring parts | | | | Plasma treatment step | | Electroplating step |
|---|---|---|---|---|---|---|---|
| | Average width [μm] | Average spacing [μm] | Void density [μm²/μm] | Maximum area of void [μm²] | Plasma treatment time [sec] | Amount of ashing [nm] | Initial current density [A/m²] |
| No. 8 | 10 | 10 | 0.018 | 0.023 | 15 | 40 | 0.020 |
| No. 9 | 10 | 10 | 0.002 | 0.001 | 30 | 450 | 0.010 |
| No. 10 | 10 | 10 | 0.014 | 0.012 | — | — | 0.005 |
| No. 11 | 20 | 20 | 0.014 | 0.011 | 15 | 40 | 0.020 |

Quality of Printed Circuit Board

Separation Ratio

Ten printed circuit boards were manufactured for each type of the printed circuit boards of Nos. 1 to 11, and whether separation between the electroless plating layer and the electroplating layer occurred was examined in each of the printed circuit boards. The case where separation occurred in at least a portion of the plurality of wiring parts was evaluated that separation occurred. A ratio of the number of samples in which separation occurred relative to the number (10) of samples of each type of the printed circuit boards was calculated as a separation ratio. Table 2 shows the calculation results.

Quality of Surface of Electroless Plating Layer

Regarding the 10 printed circuit boards of each type, the surface of the electroless plating layer after the plasma treatment step or the alkali treatment step was visually observed, and the quality of the surface of the electroless plating layer was evaluated in accordance with the following criteria. Table 2 shows the evaluation results.
A: Degradation such as burning, scratches, or melting is not visually observed on the surface of the electroless plating layer.
B: Degradation such as burning, scratches, or melting is visually observed on the surface of the electroless plating layer.

TABLE 2

| | Separation ratio [%] | Quality of surface of electroless plating layer |
|---|---|---|
| No. 1 | 0 | A |
| No. 2 | 0 | A |
| No. 3 | 0 | A |
| No. 4 | 0 | A |
| No. 5 | 0 | A |
| No. 6 | 0 | A |
| No. 7 | 0 | A |
| No. 8 | 50 | A |
| No. 9 | 0 | B |
| No. 10 | 10 | B |
| No. 11 | 0 | A |

EVALUATION RESULTS

As shown in Tables 1 and 2, in Nos. 1 to 7 and No. 9, in which the void density is 0.01 μm²/μm or less, the separation ratio between the electroless plating layer and the electroplating layer is suppressed to 0%. In particular, Nos. 1 to 7, in which the amount of asking of the resist pattern through the plasma treatment step is 60 nm or more and 300 nm or less, have good quality of the surface of the electroless plating layer. Note that No. 10, which has a void density of 0.014 μm²/μm, has a separation ratio of 10%, whereas No. 11, in which the wiring width and the wiring spacing of the plurality of wiring parts are each 20 μm, has a separation ratio of 0% while the void density is the same as that of No. 10. This shows that when a plurality of wiring parts are arranged at a fine pitch, adhesiveness between the electroless plating layer and the electroplating layer tends to be insufficient, and it is necessary to control the void density at the interface between the electroless plating layer and the electroplating layer in order to cause these two layers to strongly adhere to each other. Furthermore, in Nos. 8 and 11, the amounts of ashing and the initial current densities are the same, whereas the void density of No. 8 is higher than the void density of No. 11. This means that when the wiring parts are arranged at a fine pitch, voids are easily generated at the interface between the electroless plating layer and the electroplating layer.

REFERENCE SIGNS LIST

| 1 base film | 2 conductive pattern |
|---|---|
| 11 wiring part | 11a electroless plating layer  11b electroplating layer |
| 11c seed layer | |
| R resist pattern | |

The invention claimed is:
1. A printed circuit board comprising:
a base film having an insulating property; and
a conductive pattern that is stacked on at least one surface of the base film and that includes a plurality of wiring parts arranged in parallel,
wherein the plurality of wiring parts have an average width of 5 μm or more and 15 μm or less,
the plurality of wiring parts have an electroless plating layer and an electroplating layer stacked on the electroless plating layer, and
a void density at an interface between the electroless plating layer and the electroplating layer in a section of the plurality of wiring parts in a thickness direction is 0.01 μm²/μm or less.
2. The printed circuit board according to claim 1, wherein a maximum area of a void formed at the interface is 0.01 μm² or less.
3. The printed circuit board according to claim 1, wherein an average spacing of the plurality of wiring parts is 5 μm or more and 15 μm or less.
4. The printed circuit board according to claim 1, wherein the electroless plating layer and the electroplating layer contain copper as a main component.
5. A method for manufacturing a printed circuit board, comprising a step of forming, by a semi-additive method, a conductive pattern including a plurality of wiring parts arranged in parallel on at least one surface of a base film having an insulating property, wherein the step of forming includes an electroless plating step of subjecting the one surface of the base film to electroless plating, a resist pattern-forming step of forming a resist pattern having an inverted shape of the plurality of wiring parts on a surface of an electroless plating layer formed in the electroless plating step, a plasma treatment step of subjecting surfaces of the resist pattern and the electroless plating layer after the resist pattern-forming step to plasma treatment, and an electroplating step of subjecting the surface of the electroless plating layer after the plasma treatment step to electroplating, the plurality of wiring parts have an average width of 5 µm or more and 15 µm or less, and an amount of ashing of the resist pattern through the plasma treatment step is 60 nm or more and 300 nm or less.

6. The method for manufacturing a printed circuit board according to claim 5, wherein an initial current density in the electroplating step is 0.003 $A/m^2$ or more and 0.015 $A/m^2$ or less.

7. The printed circuit board according to claim 1, wherein the void density is 0.001 $\mu m^2/\mu m$ or more and 0.01 $\mu m^2/\mu m$ or less.

8. The printed circuit board according to claim 1, wherein a void is formed at the interface.

9. The printed circuit board according to claim 8, wherein a maximum area of the void formed at the interface is 0.01 $\mu m^2$ or less.

10. The printed circuit board according to claim 8, wherein a maximum area of the void formed at the interface is 0.001 $\mu m^2$ or more and 0.01 $\mu m^2$ or less.

* * * * *